United States Patent
Bradshaw

Patent Number: 5,112,724
Date of Patent: May 12, 1992

[54] LITHOGRAPHIC METHOD

[75] Inventor: Keith Bradshaw, Garland, Tex.

[73] Assignee: Texas Instruments Incorporated, Dallas, Tex.

[21] Appl. No.: 443,991

[22] Filed: Nov. 30, 1989

[51] Int. Cl.⁵ .................................... G03C 5/00
[52] U.S. Cl. ........................... 430/296; 430/394; 430/494; 430/942
[58] Field of Search ............ 430/296, 394, 494, 942

[56] References Cited

U.S. PATENT DOCUMENTS 4,504,558  3/1985  Bohlen et al. ................. 430/296

OTHER PUBLICATIONS

Howard et al., "Nanometer-Scale Fabrication Techniques", Academic Press 1982, VLSI Electronics: Microstructure Science, vol. 5, pp. 145-189.

Primary Examiner—Charles L. Bowers, Jr.
Assistant Examiner—J. Weddington
Attorney, Agent, or Firm—Richard A. Stoltz; Rene E. Grossman; Richard L. Donaldson

[57] ABSTRACT

An electron beam lithography method with multiple low-dose scans by an electron beam (320) exposes a resist (402) pattern.

6 Claims, 6 Drawing Sheets

LITHOGRAPHIC METHOD

BACKGROUND OF THE INVENTION

1. Field of the Invention

The present invention relates to fabrication of items with small features, and, more particularly, to lithographic methods of fabrication such as are used in semiconductor integrated circuits.

2. Description of the Related Art

Semiconductor-based electronic integrated circuits have progressively shrunk in feature size and increased in complexity since their invention in 1958, and currently mass-produced integrated circuits such as computer memory chips have feature sizes on the order of 1 μm. Such integrated circuits are typically fabricated using photolithography which patterns a layer of photoresist (a radiation sensitive material) on the in-process integrated circuit by exposure of the photoresist to masked radiation such as visible light or ultraviolet light. The radiation causes a chemical change in the photoresist, and the exposed areas of the photoresist may then be selectively removed (positive photoresist) or retained (negative photoresist) by contact with a solvent. The patterned photoresist is then used as a mask in a step (such as etching, deposition, ion implantation, etc.) of the fabrication process for the integrated circuit.

FIGS. 1a-c illustrate in cross sectional elevation views the formation and use of photoresist as an implantation mask. As shown in FIG. 1a photoresist (positive) 102 is applied to substrate 104, photoresist 102 is typically 1 μm thick. Next, ultraviolet radiation 106 is passed through pattern mask 108 and exposes photoresist 102 in the pattern of mask 108; see FIG. 1b. The exposed portion of photoresist 102 is then removed (photoresist 102 is developed) by dissolution in a solvent, and the developed photoresist 102 may then be used as a mask for ion implantation of dopants 110 to form doped regions 112 in substrate 104; see FIG. 1c.

The feature size obtainable using photoresist lithography is limited by diffraction effects, with resulting dimensions having a lower limit of about 0.1 μm even if ultraviolet light is used for the photoresist exposure. That is, in the exposure step illustrated in FIG. 1b, the wavelength of light 106 is comparable to the size of the openings in mask 108 and the light passing through the openings is severely diffracted. In contrast, the use of resists sensitive to short wavelength entities such as electrons, ions, or x-rays will eliminate this diffraction limitation, but then the limitations of the resist material itself become important. For example, electron beams can be focussed down to a spot size of the order of 10 Å, and can be used to directly write on (expose) a resist layer without the use of a pattern mask. The typical electron beam resist, polymethylmethacrylate (PMMA), is exposed by the incident electrons breaking bonds (e.g., carbon-carbon bonds) to make the PMMA more soluble in a developer such as methylisobutylketone (MIBK). A spot size of less than 10 Å for the incident electron beam can be formed and accurately controlled with digital and analog techniques. However, the electrons in the electron beam are charged particles and any static charges in the PMMA will deflect the beam and become a feature size limitation. This is in contrast to photolithography which uses uncharged photons for exposure. Molecular size and statistical effects may also limit feature size. See R. Howard et al, Nanometer-Scale Fabrication Techniques in 5 VLSI Electronics: Microstructure Science, pp. 150-153 (Academic Press 1982).

Statistical fluctuations in the beam flux of incident electrons and charging effects due to statistical fluctuations in the static charge of atomic cores whose bonding electrons have been partially displaced and (secondary and backscattered primary) electrons deposited in the (insulating) resist also affect the feature size limitation for electron beam direct write exposure of resist. Indeed, the electric fields of unbonded cores and displaced bond electrons in the resist (charging effect) deflect incoming beam electrons and distort the exposed image. See schematic illustration in FIG. 2 which exaggerates the deflections and beam width.

Attempts to overcome the feature size limitations of standard electron beam lithography due to charging effects includes the use of conducting resists. However, these approaches are not manufacturable.

Photolithography systems that use a scanning laser beam for photoresist exposure have problems related to the vibration of the substrate coated with photoresist relative to the laser beam. This vibration causes roughness in the edges of the resulting photoresist pattern. Attempts to overcome this edge roughness include making three scans of the laser beam at one third of the intensity over the same pattern.

SUMMARY OF THE INVENTION

The present invention provides for electron lithography with the use of multiple low electron-dose beam scans of the same pattern for resist exposure. This solves the problems of the known methods of resist exposure for small feature size electron beam lithography by reducing charging effects.

BRIEF DESCRIPTION OF THE DRAWINGS

The drawings are schematic for clarity.

DESCRIPTION OF THE PREFERRED EMBODIMENTS

Figure 1A:
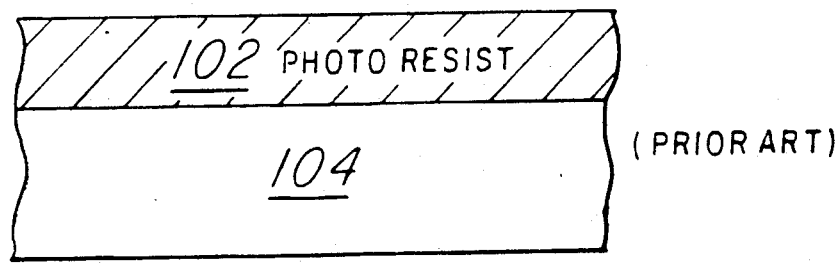
FIGS. 1a-c are cross sectional elevation views of prior art mask lithography.
Figure 1B:
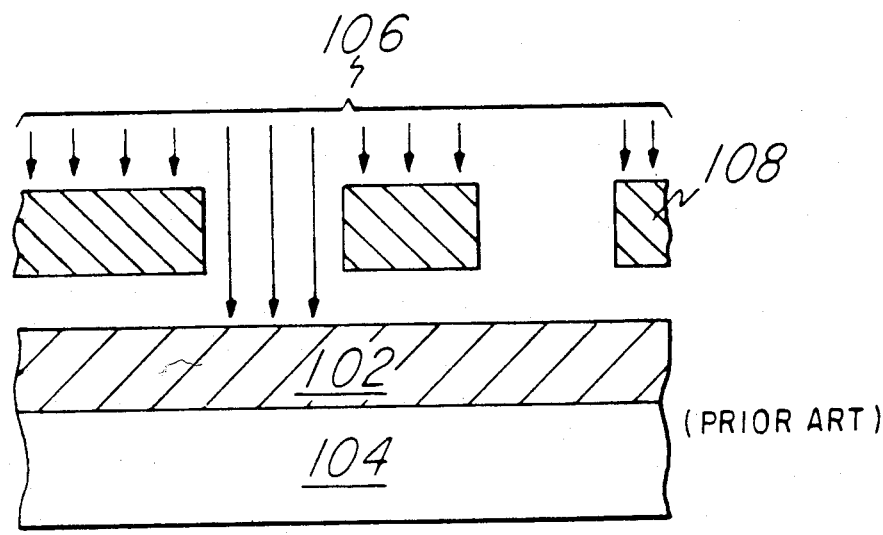
Figure 1C:
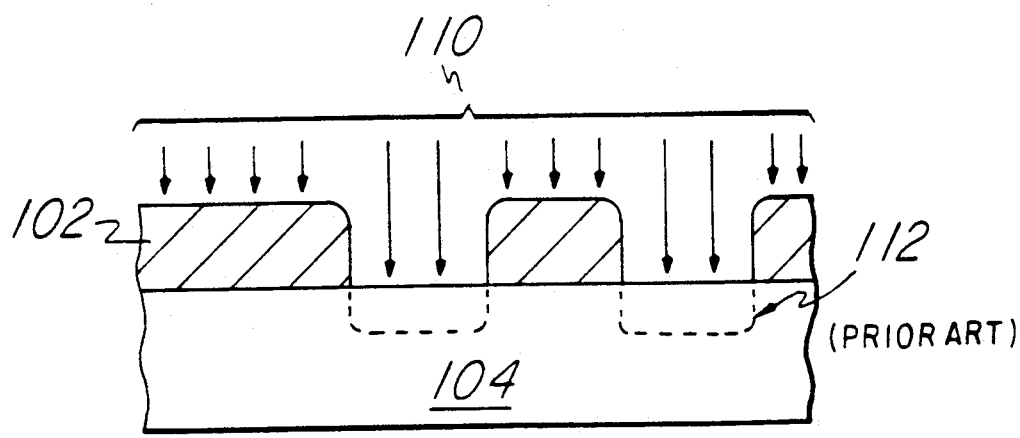
Figure 2:
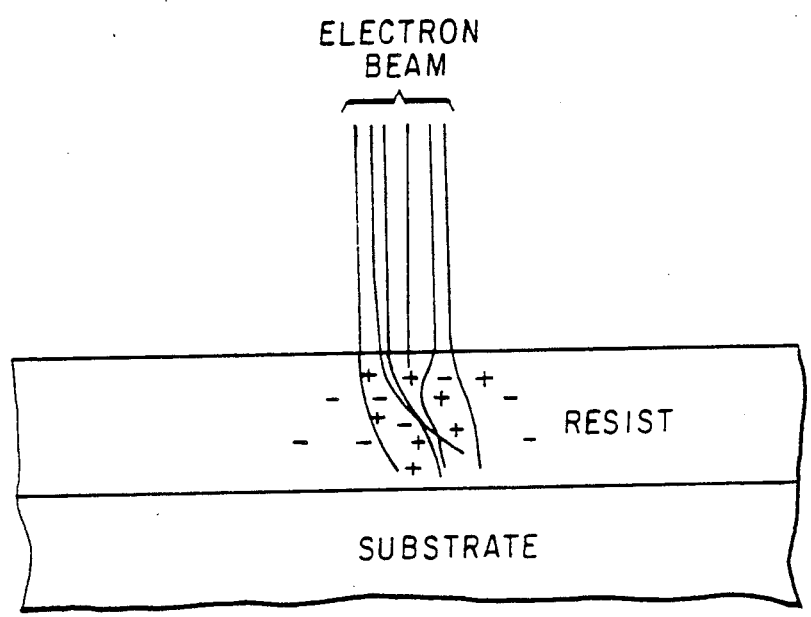
FIG. 2 illustrates deflection of the incident electron beam due to charging of the resist.
Figure 3:
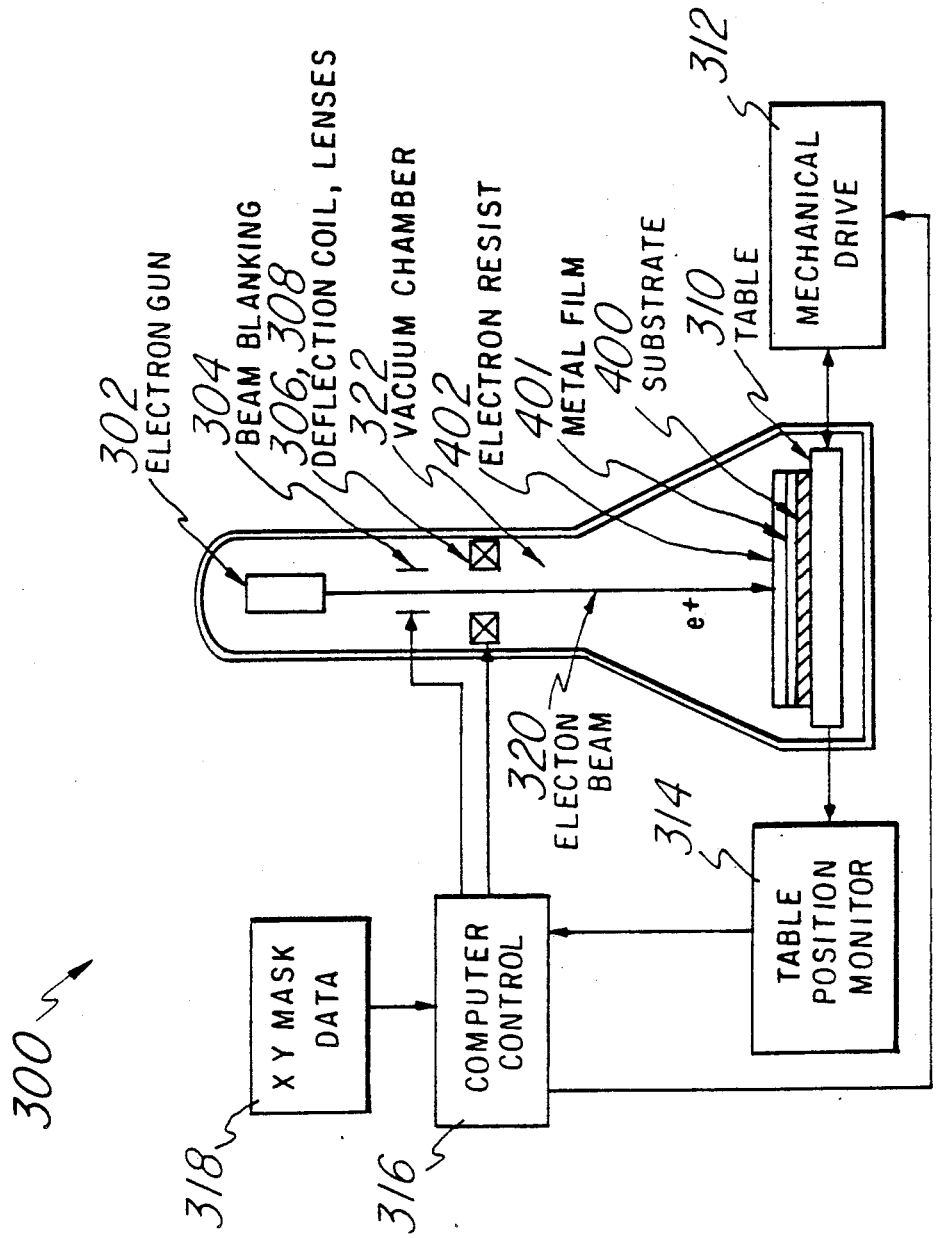
FIG. 3 is a schematic cross sectional elevation view of an electron beam lithography machine.

FIG. 3 is a schematic cross sectional elevation view of an apparatus, generally denoted 300, for using the first preferred embodiment method of electron beam lithography. Apparatus 300 is a standard electron beam machine and typically would include multiple lenses rather than the single lens illustrated. Apparatus 300 includes electron gun 302, beam blanker 304 (which just electrostatically deflects the beam into a stop), deflection coils 306 which provide the scanning of the beam across the target substrate, electrostatic and magnetic lenses 308 for focussing the beam of positrons to a spot on the target substrate, movable table 310 for holding the substrate, mechanical drive 312 for positioning table 310, position monitor 314 for detecting the position of table 310, pattern data memory 318 which is input to computer 316 for controlling beam blanker 304, deflection coils 306, lenses 308, and mechanical drive 312. Electron beam 320 and target substrate are held within vacuum chamber 322. Electron gun 302 generates electrons of energies about 20 KeV (although this is adjustable) and a current of about 1 nA (this also is adjustable). A higher energy beam 320 results in less Coulombic spreading due to the shorter time of flight, but a low beam current (10 pA as opposed to typical 1 nA electron beams) implies low charge density and minimal Coulombic spreading.

The first preferred embodiment method of lithography proceeds as follows:

(a) Coat substrate 400 with PMMA (polymethylmethacrylate) 402 to a thickness of 1 μm; this coating may be by spinning PMMA 402 onto substrate 400. Note that substrate 400 may be a semiconductor such as gallium arsenide (GaAs) or silicon already coated with layers of dielectrics, semiconductors, and conductors such as metal layer 401, and PMMA 402 is spun onto the top layer. Insert coated substrate 400 onto table 310 in apparatus 300. The pattern for PMMA 402 exposure is stored in memory 318 of apparatus 300.

Figure 4A:
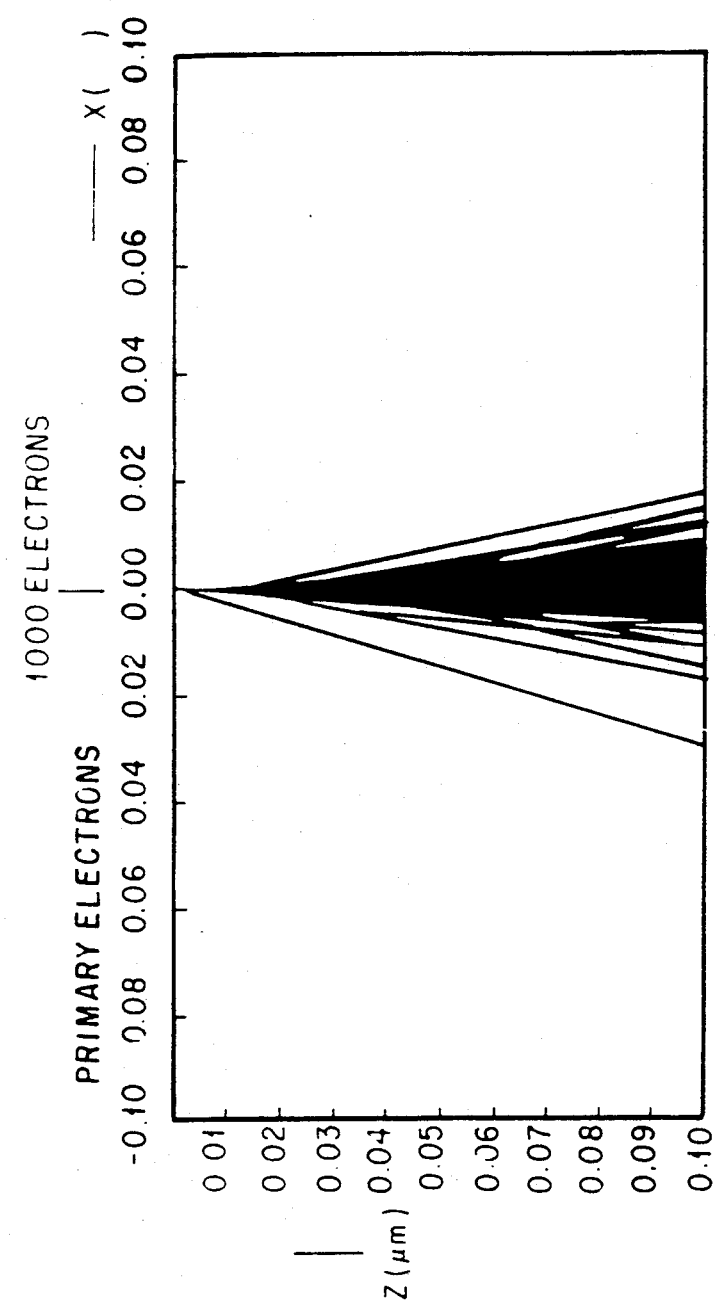
FIGS. 4a-b illustrate electron beam penetration and secondary electron generation in resist.
Figure 4B:
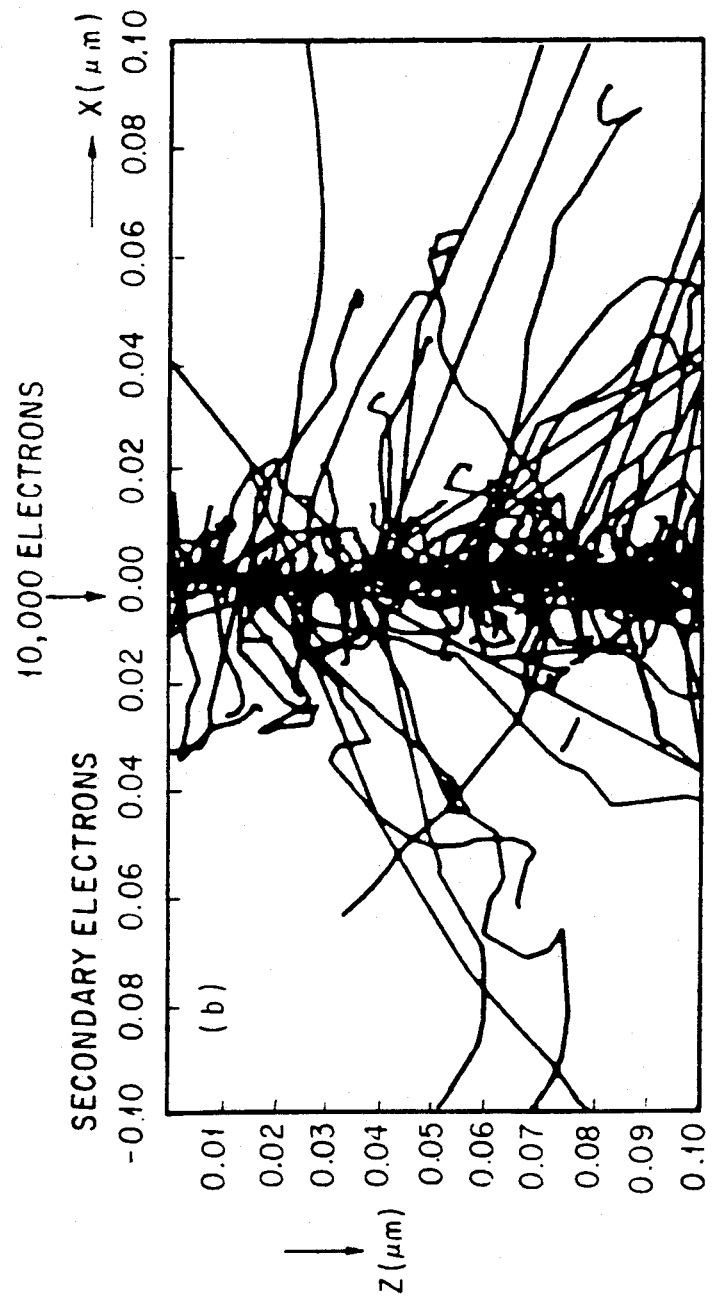

(b) Activate electron gun 302 to generate electron beam 320 and raster scan electron beam 320 across PMMA 402 on coated substrate 400 by deflection coils 306 with the intensity of electron beam 320 switched between zero and 1 nA by beam blanker 304. Lenses 308 focus beam 320 to a spot size of 10 A at the top of PMMA 402. The electrons in beam 320 have an average energy of about 20 KeV, and upon penetrating PMMA 402 break chemical bonds (including the carbon-carbon polymerization bonds) due to their inelastic scattering of electrons constituting the chemical bonds. The scanning rate is set so that the 1 nA beam provides only 11% of the dose of electrons needed to expose PMMA 402. The inelastic scattering of the electrons produces secondary electrons with energies on the order of 100 eV, and these electrons propagate on the order of 100-1000 A while disspating their energy. The net effect is a transfer of negative charge out from the location of the beam penetration of PMMA 402 during the exposure; see FIGS. 4a-b which are simulations of electrons penetrating resist and creating secondary electrons. This leaves a net positive charge at the penetration location and a net negative charge away from the penetration location. Note that since the dose of electrons is only 11% of that needed for full exposure, the static charge generated is only about 11% of the static charge generated by a full dose, and less deflection occurs.

(c) Repeat the scanning of step (b) eight more times. This achieves a total dose of electrons sufficient to fully expose PMMA 402. The time between scans permits the net charges generated to migrate and average out. Thus the electron beam during the second scan does not see the same static charge distribution as was generated by the first scan, but rather sees an averaged version which will provide less deflection. In this manner the use of nine scans at 11% dose provides the desired full exposure but with less beam deflection and thus less spatial fluctuations.

Figure 5:
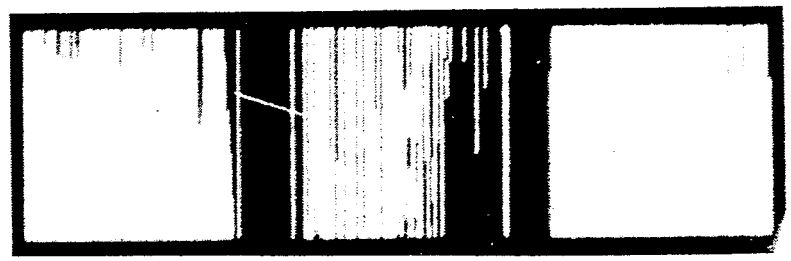
FIGS. 5a-c illustrate the effect of the first preferred embodiment method.

(d) Remove coated substrate 400 with PMMA 402 from chamber 322, and develop the exposed PMMA 402 with a mixture of methyl isobutyl ketone and isopropyl alcohol; that is, PMMA 402 is a positive resist with the exposed portion (broken bonds) removed during development. Then use the thus patterned PMMA 402 as a mask for ion implantation, etching, or lift-off deposition in the standard manner. FIGS. 5a-c are portions of a single SEM with FIG. 5a showing the use of the first preferred embodiment patterned PMMA 402 for lift-off and compares it to the same lift-off using a single scan 100% dose exposure and a five scan 20% dose exposure. In particular, the pattern was a square and FIG. 5a is the first preferred embodiment nine scans at 11%, FIG. 5b is five scans at 20%, and FIG. 5c is one scan at 100%.

The second preferred embodiment method of lithography uses the same apparatus 300 as the first preferred embodiment and also uses multiple low-dose scans of the electron beam to expose PMMA, but the second preferred embodiment weights the dose as follows: the first three scans are at only 3% dose each and the last six scans are at 15% dose each. The second preferred embodiment anticipates the typical situation of the maximum error occurring in the first scans as the column is charging and the table 310 is settling.

MODIFICATIONS AND ADVANTAGES

Various modifications of the preferred embodiment devices and methods may be made while retaining the features of multiple partial exposures.

For example, the number of scans over the same pattern could be increased to ten or more, although this may increase overall exposure time due to limits scan rate, or could be decreased to eight or seven or fewer depending upon acceptability of the results. Various resists and charged particle beams could be used; low-contrast, high-sensitivity electron beam resists could have their contrast enhanced by use of the multiple scans to reduce the amount of peripheral exposure caused by scattering. The line-space resolution of the resist will be improved by the reduction in proximity effect producing secondary exposure.

The invention provides the advantages of smaller feature size for a given electron beam apparatus and system.

What is claimed is:

1. A method of lithography, comprising the steps of:
   (a) providing a resist layer;
   (b) exposing a predetermined pattern on said resist layer with an electron beam to provide less than full exposure of said resist, the net charges generated onto said resist by said electron beam migrating and averaging out before a subsequent exposure step to thereby obtain less beam deflection and thus less spatial fluctuation;
   (c) then repeating step (b) at least once on the totality of said predetermined pattern until said predetermined pattern is fully exposed; and
   (d) then developing said fully exposed resist.

2. The method of lithography of claim 1, wherein:
   (a) said repeating step (d) includes between six and ten repetitions.

3. The method of lithography of claim 2, wherein:
   (a) said repeating step (d) includes a total of ten exposures.

4. A method of lithography, comprising the steps of:
   (a) providing a resist layer;
   (b) exposing a predetermined pattern on said resist layer with an electron beam to provide less than full exposure of said resist, the net charges generated onto said resist by said electron beam migrating and averaging out before a subsequent exposure step;
(c) then repeating step to thereby obtain less beam deflection and thus less spatial fluctuation (b) at least eight times until said resist is fully exposed, the initial three of said step (b) having an electron dose of about 3% for exposure and the final six of said step (b) having an electron dose of about 15% for exposure; and
(e) developing said fully exposed resist.

5. The method of lithography of claim 1, wherein:
(a) said resist is PMMA.

6. A method of lithography, comprising the steps of:
(a) providing a resist layer;
(b) exposing a predetermined pattern on said resist layer with an electron beam to provide less than full exposure of said resist, the net charges generated onto said resist by said electron beam migrating and averaging out before a subsequent exposure step to thereby obtain less beam deflection and thus less spatial fluctuation.
(c) then repeating step (b) at least once until said resist is fully exposed, the initial said step (b) having a lower electron dose than that of the final said step (b); and
(e) developing said fully exposed resist.

* * * * *